United States Patent
Kommera et al.

(10) Patent No.: US 7,855,151 B2
(45) Date of Patent: Dec. 21, 2010

(54) FORMATION OF A SLOT IN A SILICON SUBSTRATE

(75) Inventors: Swaroop K. Kommera, Corvallis, OR (US); Siddhartha Bhowmik, Salem, OR (US); Richard J. Oram, Corvallis, OR (US); Sriram Ramamoorthi, Corvallis, OR (US); David M. Braun, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 640 days.

(21) Appl. No.: 11/894,316

(22) Filed: Aug. 21, 2007

(65) Prior Publication Data

US 2009/0053898 A1 Feb. 26, 2009

(51) Int. Cl.
*H01L 21/461* (2006.01)
(52) U.S. Cl. ............... 438/734; 438/700; 438/702; 438/703; 438/704; 438/712; 257/E21.249
(58) Field of Classification Search ......... 438/700, 438/701, 702, 703, 704, 712, 734; 257/E21.249
See application file for complete search history.

(56) References Cited

U.S. PATENT DOCUMENTS

| | | | |
|---|---|---|---|
| 5,658,471 A | 8/1997 | Murthy et al. | |
| 6,402,301 B1 | 6/2002 | Powers et al. | |
| 6,406,134 B1 | 6/2002 | Hu et al. | |
| 6,409,312 B1 | 6/2002 | Mrvos et al. | |
| 6,500,348 B2 | 12/2002 | Chase et al. | |
| 6,517,734 B1 | 2/2003 | Muller et al. | |
| 6,541,922 B2 * | 4/2003 | Shirozu | 315/169.4 |
| 6,629,756 B2 | 10/2003 | Wang et al. | |
| 6,693,045 B2 | 2/2004 | Hsu et al. | |
| 6,716,661 B2 | 4/2004 | Zou et al. | |
| 6,902,867 B2 | 6/2005 | Hall et al. | |
| 6,930,055 B1 | 8/2005 | Bhowmik et al. | |
| 6,964,743 B2 | 11/2005 | Min et al. | |
| 7,033,515 B2 | 4/2006 | Kouma et al. | |
| 7,041,226 B2 | 5/2006 | Vaideeswaran et al. | |
| 7,063,799 B2 | 6/2006 | Hayakawa et al. | |
| 7,186,349 B2 | 3/2007 | Hu et al. | |
| 7,205,097 B2 | 4/2007 | Fukunaga et al. | |
| 2003/0054645 A1 | 3/2003 | Sheldon | |
| 2003/0066816 A1 | 4/2003 | Schultz et al. | |
| 2003/0117449 A1 * | 6/2003 | Cahill et al. | 347/7 |
| 2004/0099631 A1 | 5/2004 | Rich et al. | |
| 2004/0119774 A1 | 6/2004 | Conta et al. | |
| 2005/0001884 A1 | 1/2005 | Hu et al. | |
| 2005/0036003 A1 | 2/2005 | Lattuca et al. | |

(Continued)

OTHER PUBLICATIONS

International Search Report for Application No. PCT/US2008/072155. Report issued Jan. 9, 2008.

*Primary Examiner*—Matthew C Landau
*Assistant Examiner*—Colleen E Snow

(57) ABSTRACT

A slot is formed that reaches through a first side of a silicon substrate to a second side of the silicon substrate. A trench is laser patterned. The trench has a mouth at the first side of the silicon substrate. The trench does not reach the second side of the silicon substrate. The trench is dry etched until a depth of at least a portion of the trench is extended approximately to the second side of the silicon substrate (12). A wet etch is performed to complete formation of the slot. The wet etch etches silicon from all surfaces of the trench.

12 Claims, 4 Drawing Sheets

U.S. PATENT DOCUMENTS

| | | |
|---|---|---|
| 2005/0070118 A1* | 3/2005 | Buchan et al. ............... 438/712 |
| 2005/0127028 A1 | 6/2005 | Chen et al. |
| 2005/0205517 A1 | 9/2005 | Krawczyk et al. |
| 2005/0231557 A1 | 10/2005 | Krawczyk et al. |
| 2005/0280674 A1 | 12/2005 | McReynolds |
| 2006/0014107 A1 | 1/2006 | Park et al. |
| 2006/0016780 A1* | 1/2006 | Bengali ....................... 216/27 |
| 2006/0057503 A1 | 3/2006 | Bertelsen et al. |
| 2006/0113277 A1 | 6/2006 | Krawczyk et al. |
| 2006/0266733 A1 | 11/2006 | Kato |
| 2007/0000863 A1 | 1/2007 | Bernard et al. |
| 2007/0042606 A1 | 2/2007 | Wang et al. |
| 2007/0052766 A1 | 3/2007 | Trauernicht et al. |
| 2007/0080132 A1 | 4/2007 | Silverbrook |

\* cited by examiner

FORMATION OF A SLOT IN A SILICON SUBSTRATE

BACKGROUND

Micro electro mechanical devices can be used to implement devices such as ink jet print cartridges and other fluid ejecting devices. In some such fluid ejecting devices, fluid can be fed through slots formed in substrates. These slots can be formed using substrate removal techniques.

DESCRIPTION OF THE EMBODIMENT

Figure 1:
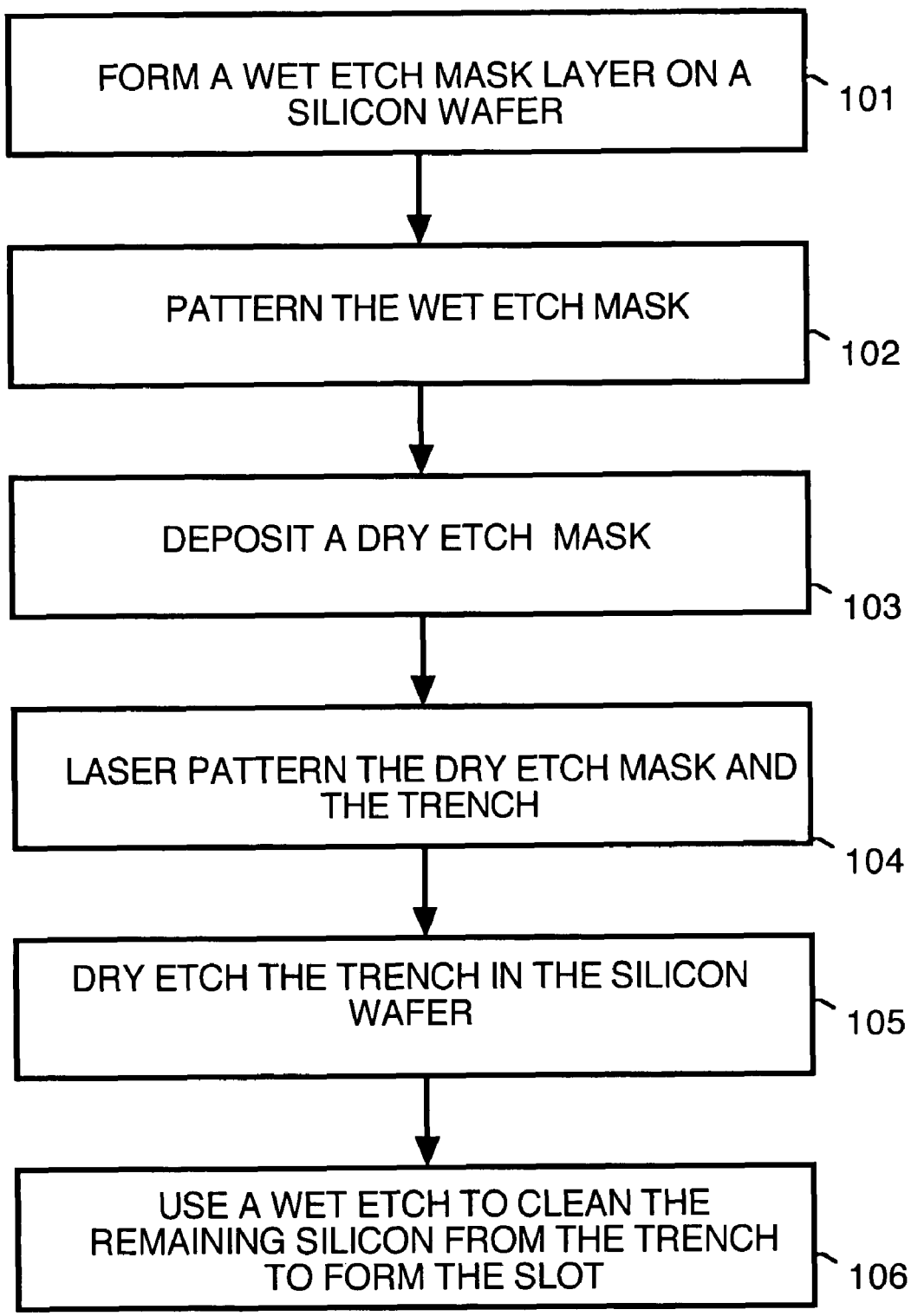
FIG. 1 is a flowchart that describes a process for forming slots in a silicon substrate in accordance with an embodiment of the present invention

FIG. 1 is a flowchart that describes a process for forming slots in a substrate. For example, the silicon substrate is initially part of a silicon wafer. In a block 101 a wet etch mask layer is formed on a silicon substrate. This is illustrated in FIG. 2.

Figure 2:
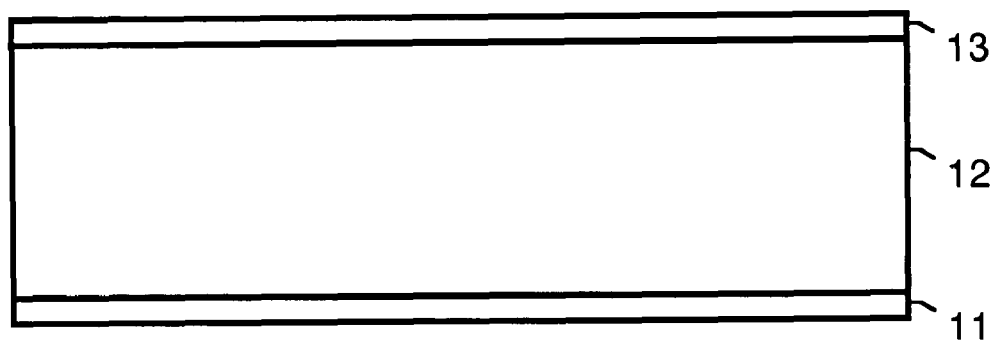
FIG. 2, FIG. 3, FIG. 4, FIG. 5, FIG. 6 and FIG. 7 illustrate the process for forming slots in a silicon substrate set out in FIG. 1 in accordance with an embodiment of the present invention.

FIG. 2 shows a cross section of a silicon substrate 12. Previously formed on a front side of silicon substrate 12 are front-side thin films 11. For example front-side thin films 11 can be used to implement electrical components such as resistors and can also include electrical traces. Front-side thin films 1 can also be used to implement a wall or surface of multiple fluid feed passageways. Front-side thin films 11 can also include a field or thermal oxide layer. Front-side thin films 11 can be continuous or discontinuous. For more information on thin films, see for example, U.S. Pat. No. 6,930,055 B1 issued on Aug. 16, 2005 to Bhowmik et al for SUBSTRATES HAVING FEATURES FORMED THEREIN AND METHODS OF FORMING.

As set out in block 101 of FIG. 1, a wet etch mask 13 is also formed on silicon substrate 12. For example, wet etch mask 13 is formed of silicon nitride or silicon dioxide or some other material capable of masking silicon substrate 12 during a wet etch process.

For example, silicon substrate 12 is 675 microns thick. For example, front-side thin films 11 are 5 microns thick. For example, wet etch mask 13 is 20 nanometers to 1 micron thick. These thicknesses are meant to be illustrative, and as will be understood by persons of ordinary skill in the art can vary significantly dependent upon the application.

Figure 3:
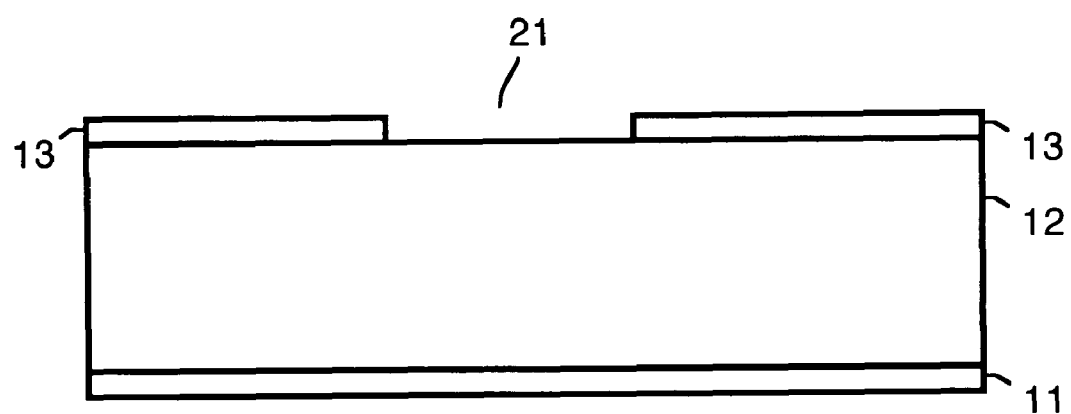

In block 102 of FIG. 1, the wet etch mask is patterned. This is illustrated by FIG. 3. In FIG. 3, wet etch mask 13 is removed over a slot area 21. Slot area 21 defines the width and length of the final slot to be constructed. For example, slot area 21 is approximately 200 microns wide and approximately 11 to 19 millimeters long. As will be understood by persons of ordinary skill in the art these dimensions are illustrative and dependent upon the application for which the slot is to be utilized.

Figure 4:
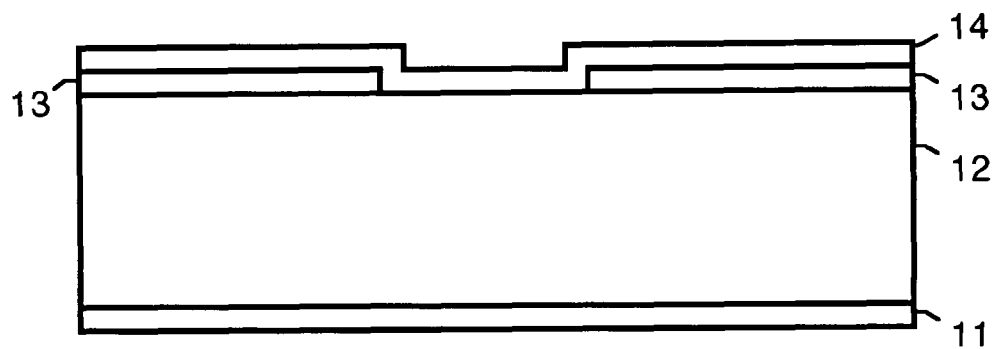

In a block 103 of FIG. 1, a dry etch mask is formed. This is illustrated in FIG. 4 by a dry etch mask 14 having been deposited over wet etch mask 13 and slot area 21 (shown in FIG. 3). For example, dry etch mask 14 is composed of Aluminum, Titanium Aluminum, Aluminum oxide or some other material capable of masking silicon substrate 12 during a dry etch process and which can also be removed during a wet etch process. The thickness of dry etch mask 14 varies dependent on the material used to form dry etch mask 14. For example, when dry etch mask 14 is formed of aluminum or titanium aluminum, a typical thickness of dry etch mask 14 is approximately 1 micron. For example, when dry etch mask 14 is formed of aluminum oxide, a typical thickness of dry etch mask 14 is approximately 300 nanometers.

Figure 5:
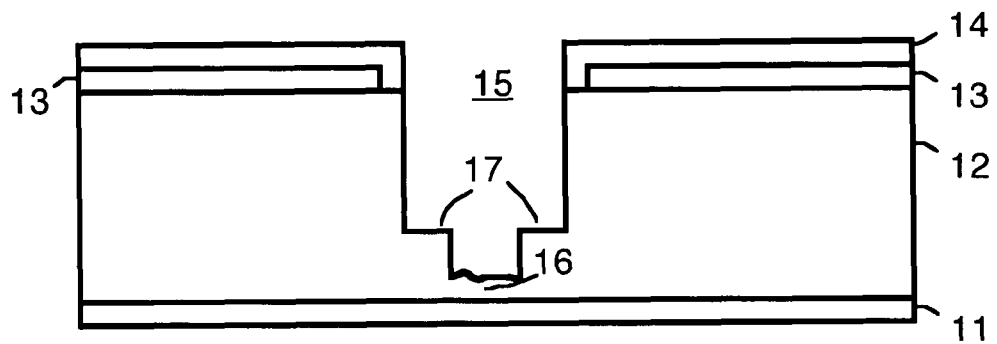

In a block 104 of FIG. 1, laser patterning is used to pattern the dry etch mask and form a trench within the silicon substrate. This is illustrated by FIG. 5. In FIG. 5, a laser has been used to laser pattern dry etch mask layer 14 and form a trench 15 within silicon substrate 12. The width of trench 15 of substrate 12 is narrower than the final width of the slot to be formed in silicon substrate 12. A portion 16 of silicon substrate 12 separates a bottom of trench 15 from thin films 11 by, for example, approximately 60 to 75 microns. Shelves 17 are located, for example, approximately 400 microns below dry etch mask layer 14. Shelves 17 are present only dependent upon the process used to perform the laser patterning. In alternative embodiments of the present invention, no shelving may occur. Shelves can occur unintentionally as a result of insufficient debris removal along the edge walls or intentionally by cutting a wide trench with the laser immediately followed with cutting a narrow trench with the same laser. For example, trench 15 can be formed using a single slow laser pass or using a sequence of multiple laser passes of various widths and lengths and positions providing a variety of bottom features including shelves.

Figure 6:
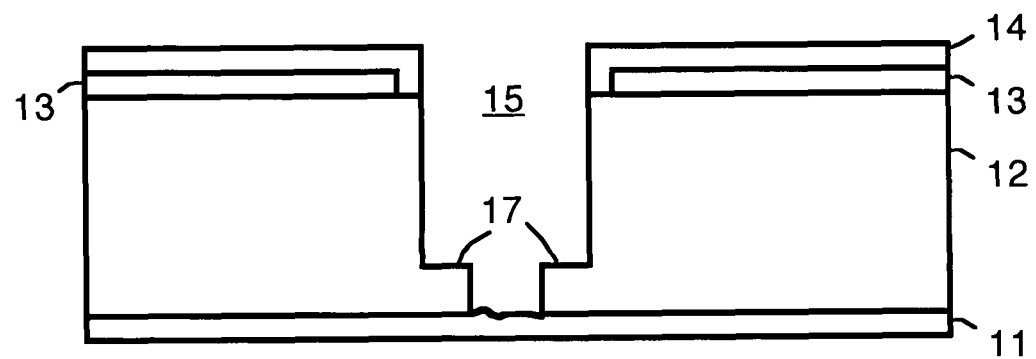

In a block 105 shown in FIG. 1, a dry etch process is used to deepen the trench. This is illustrated in FIG. 6. In FIG. 6, a dry etch process has been used to remove portion 16 of silicon substrate, shown in FIG. 5. For example, the dry etch process used is a reactive ion etching process that etches within trench 15 to extend trench 15 so that at least a portion of thin films 11 is reached at the front side of silicon substrate 12.

Figure 7:
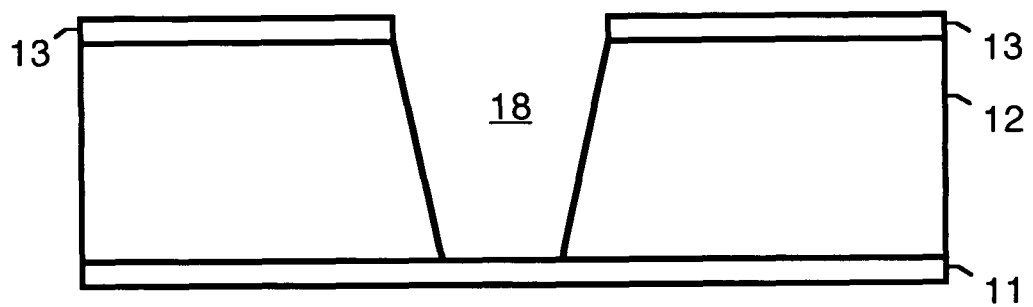

In a block 106 shown in FIG. 1, a wet etch is used to clean the remaining silicon from the slot. This is illustrated in FIG. 7 where a wet etch is used to complete the transformation of trench 15 (shown in FIG. 6) into a slot 18. The wet etch also removed dry etch mask 14 as well as smoothed out shelves 17 shown in FIG. 6.

The use of the combination of laser patterning, dry etch and wet etch processes, as set out above, allows the fabrication of narrow (less than 200 micron) slots that enable die shrinkage, increases the separation ratio between slots and thus decreases the die cost of dies formed of the silicon substrate. This allows slot widths to approach the width of ink feed holes formed through thin films 12. This is performance advantage over processes that just use just a combination of laser patterning and a wet etch to form slots. The use of the combination of laser patterning, dry etch and wet etch processes, as set out above, also results in significantly less usage of fluorocarbon gasses when compared to processes that use just dry etch and wet etch to form slots.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for forming a slot that reaches through a first side of a silicon substrate to a second side of the silicon substrate, the method comprising:

placing wet etch masking material over the first side of the silicon substrate;

removing the wet etch masking material to expose a trench area;

placing dry etch masking material over the exposed trench area and the wet etch masking material;

laser patterning a trench, the trench not reaching to the second side of the silicon substrate;

dry etching the trench until a depth of the trench is extended approximately to the second side of the silicon substrate; and, performing a wet etch to complete formation of the slot, the wet etch removing the dry etch masking material and etching silicon from all surfaces of the trench.

2. A method as in claim 1 wherein dry etching the trench is performed using a reactive ion etching process.

3. A method as in claim 1 wherein thin films are located on the second side silicon substrate and the slot reaches from the first side of the silicon substrate to the thin films located on the second side of the silicon substrate.

4. A method as in claim 1 wherein the laser patterning of the trench results in shelf areas being formed within the trench.

5. A method as in claim 1 wherein the laser patterning of the trench results in approximately 60 to 75 microns of silicon remaining between a bottom of the trench and the second side of the silicon substrate.

6. A method as in claim 1 wherein when the trench is laser patterned, the trench has a width at the mouth of the trench that is less than a full width of the slot.

7. A method for forming a slot that reaches through a first side of a silicon substrate to thin films located on a second side of the silicon substrate, the method comprising:

placing wet etch masking material over the first side of the silicon substrate;

removing the wet etch masking material to expose a trench area;

placing dry etch masking material over the exposed trench area and the wet etch masking material;

laser patterning a trench, the trench having a mouth at the first side of the silicon substrate and the trench not reaching the thin films;

dry etching the trench until a depth of at least a portion of the trench is extended approximately to the second side of the silicon substrate; and, performing a wet etch to complete formation of the slot, the wet etch etching silicon from all surfaces of the trench.

8. A method as in claim 7 wherein dry etching the trench is performed using a reactive ion etching process.

9. A method as in claim 7 wherein the laser patterning of the trench results in shelf areas being formed within the trench.

10. A method as in claim 7 wherein the laser patterning of the trench results in approximately 60 to 75 microns of silicon remaining between a bottom of the trench and the second side of the silicon substrate.

11. A method as in claim 7 wherein performance of the wet etch results in removal of a dry etch mask used to perform the dry etch.

12. A method as in claim 7 wherein when the trench is laser patterned, the trench has a width at the mouth of the trench that is less than a full width of the slot.

* * * * *